(12) United States Patent
Kanda et al.

(10) Patent No.: US 6,555,607 B1
(45) Date of Patent: Apr. 29, 2003

(54) WATER-SOLUBLE RESIN COMPOSITION

(75) Inventors: Takashi Kanda, Shizuoka (JP); Hatsuyuki Tanaka, Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/786,245

(22) PCT Filed: Jun. 16, 2000

(86) PCT No.: PCT/JP00/03924

§ 371 (c)(1), (2), (4) Date: Feb. 28, 2001

(87) PCT Pub. No.: WO01/00735

PCT Pub. Date: Jan. 4, 2001

(30) Foreign Application Priority Data

Jun. 29, 1999 (JP) ............................................. 11-182778

(51) Int. Cl.⁷ ............................. C08L 61/00; C08L 61/20
(52) U.S. Cl. .................... 524/366; 524/376; 524/377; 524/378; 524/379; 525/56; 525/58; 525/156; 525/157
(58) Field of Search ............................. 525/56, 57, 58, 525/59, 60, 156, 157; 524/366, 376, 377, 378, 379

(56) References Cited

U.S. PATENT DOCUMENTS 5,820,491 A * 10/1998 Hatch et al.
6,180,244 B1 * 1/2001 Rayner et al.

OTHER PUBLICATIONS

Mori, CAPLUS AN1994:617650.*
Skofronick et al. CAPLUS AN 1969:492865.*

* cited by examiner

*Primary Examiner*—Jeffrey Mullis
(74) *Attorney, Agent, or Firm*—Andrew F. Sayko, Jr.; Scott E. Hanf

(57) ABSTRACT

A water-soluble resin composition comprising (1) a water-soluble resin, (2) a water-soluble crosslinking agent, (3) at least one of surface active agents selected from acetylene alcohols, acetylene glycols, polyethoxylates of acetylene alcohols and polyethoxylates of acetylene glycols, and (4) a solvent consisting of water or a mixture of water and a water-soluble solvent. This water-soluble resin composition is applied onto a resist pattern, then heated to crosslink by an acid supplied from the resist, followed by development to remove the non-crosslinked water-soluble resin coating layer. This water-soluble resin composition is excellent in coating characteristics on steps of resist patterns and in dimensional regulation upon fining of patterns so that resist patterns such as trench patterns and hole patterns can effectively be fined.

9 Claims, No Drawings

WATER-SOLUBLE RESIN COMPOSITION

TECHNICAL FIELD

The present invention relates to a novel water-soluble resin composition and a fine pattern-forming material comprising the water-soluble resin composition. In particular, the present invention relates to a water-soluble resin composition which is coated on resist patterns formed and then crosslinked for thickening the resist patterns to fine effectively trench patterns or hole patterns and reduce the size of a space in the resist patterns without investment in expensive facilities such as an exposure unit for short wavelengths or a phase-shift reticle in a process for producing semiconductor devices etc., and a fine pattern-forming material comprising said water-soluble resin composition.

PRIOR ART

Photolithographic techniques has been traditionally used for the formation of fine elements or the fine processing in many fields such as the fabrication of semiconductor integrated circuits such as an LSI, the production of the display plane of a liquid crystal display device in an LCD panel, and the production of a circuit substrate for a thermal head and the like. To form resist patterns by photolithographic techniques, various positive- or negative-working radiation-sensitive resin compositions have been used. In recent years, as higher integration of semiconductor devices, the width of wires and separation gaps required in a production process become increasingly fine. To cope with this requirement, there are various attempts such as fining resist patterns with a light of shorter wavelength, forming fine resist patterns by means of a phase-shift reticle etc., and developing novel resists. In the conventional photolithographic techniques using exposure, however, formation of fine resist patterns exceeding the limit of wavelength is difficult, and exposure units for short wavelengths and devices using a phase-shift reticle are expensive. Accordingly, a method of forming fine patterns described below has been proposed. That is, after resist patterns are formed in a known method of forming patterns by using a known positive- or negative-working radiation-sensitive resin composition, a coating layer is applied onto the resist patterns formed, and then the resist is heated and/or exposed to generate an acid to be diffused onto the coating layer. By the diffused acid, the coating layer is crosslinked to thicken the resist patterns, and as a result, gaps in the resist patterns are thinned. Thereby the resist patterns make fine and the fine resist patterns below the resolution limit are effectively formed. Various coating layer-forming compositions usable in the above method are known (e.g. JP-A Hei5-241348, JP-A Hei6-250379, JP-A Hei10-73927 etc.).

As the composition for forming said coating layer, a water-soluble resin composition comprising a water-soluble resin, a water-soluble crosslinking agent and as necessary a plasticizer and a surface active agent and generating crosslinking reaction in the presence of an acid has been proposed. However, the conventionally known water-soluble resin composition is poor in the uniformity of coating film on steps of resist patterns and is accordingly poor also in the ability to regulate the dimension of patterns upon fining thereof. Therefore, there is demand for further development in respect of improvement of yield.

The object of the present invention is to provide a water-soluble resin composition which can be used in a pattern-forming method, wherein the composition is coated on resist patterns formed in a conventional method and the resulting coating layer is crosslinked for thickening the resist patterns thereby effectively fining the trench patterns or hole patterns under the resolution limit, and which can form a coating layer excellent in coating characteristics on steps of resist patterns and in dimensional regulation of patterns upon fining thereof.

The other object of the present invention is to provide a fine pattern-forming material comprising the water-soluble resin composition described above.

DISCLOSURE OF INVENTION

As a result of their eager study and investigation, the present inventors found that the above-mentioned objects can be attained and a water-soluble resin composition, which is applied onto resist patterns after formation thereof, excellent in coating characteristics on steps of resist patterns and in dimensional regulation of patterns upon fining thereof can be obtained by the incorporation of a specific surface active agent to a water-soluble resin composition comprising a water-soluble resin and a water-soluble crosslinking agent and generating crosslinking reaction in the presence of an acid, thus having achieved the present invention based on the finding.

That is, the water-soluble resin composition of the present invention comprises a water-soluble resin, a water-soluble crosslinking agent, a surface active agent and a solvent and brings about crosslinking reaction in the presence of an acid, wherein as the surface active agent there is used at least one member selected from the group consisting of acetylene alcohols, acetylene glycols, polyethoxylates of acetylene alcohols and polyethoxylates of acetylene glycols.

Hereinafter, the present invention is described in more detail.

The water-soluble resin used in the water-soluble resin composition of the present invention may be any known conventional polymer having a water solubility of 0.1% by weight or more. Specifically, examples of the water-soluble resin are homopolymers or copolymers containing hydrophilic units which include e.g. polyvinyl alcohol (including partially saponified products), polyacrylic acid, polymethacrylic acid, poly(2-hydroxyethyl acrylate), poly(2-hydroxyethyl methacrylate), poly(4-hydroxybutyl acrylate), poly(4-hydroxybutyl methacrylate), poly(glucosiloxyethyl acrylate), poly(glucosiloxyethyl methacrylate), polyvinyl methyl ether, polyvinyl pyrrolidone, polyethylene glycol, polyvinyl acetal (including partial-acetal products), polyethylene imine, polyethylene oxide, styrene-maleic anhydride copolymer, polyvinyl amine, polyallyl amine, oxazoline group-containing water-soluble resin, water-soluble melamine resin, water-soluble urea resin, alkyd resin, and sulfonamide, as well as salts thereof. These may be used singly or in a combination of two or more thereof.

The molecular weight of the water-soluble resin used is preferably 1,000 to 10,000, more preferably 2,000 to 5,000 in terms of weight average molecular weight. Usually, if the molecular weight of the water-soluble resin is lower than 1,000, the resulting composition is inferior in coating properties to make preparation of a uniform coating difficult, and the coating is poor in stability with time, while if the molecular weight is higher than 10,000, the resulting composition shows the phenomenon of stringing at the time of coating, and is poor in spreadability on the surface of a resist, thus making formation of a uniform coating difficult upon dropping in a small amount.

The water-soluble crosslinking agent used in the water-soluble resin composition of the present invention is not particularly limited insofar as it is a water-soluble compound crosslinking the water-soluble resin by generating an acid. Examples of the water-soluble crosslinking agent which can be used in the present invention include melamine-based low-molecular derivatives, guanamine-based low-molecular derivatives, urea-based low-molecular derivatives, glycoluril, alkoxy alkylated amino resin etc.

The melamine-based low-molecular derivatives include melamine, methoxy methylated melamine, ethoxy methylated melamine, propoxy methylated melamine, butoxy methylated melamine and hexamethylol melamine.

The guanamine-based low-molecular derivatives include acetoguanamine, benzoguanamine and methylated benzoguanamine. The urea-based low-molecular derivatives include urea, monomethylol urea, dimethylol urea, alkoxy methylene urea, N-alkoxy methylene urea, ethylene urea, and ethylene urea carboxylic acid.

The alkoxy alkylated amino resin includes alkoxy alkylated melamine resin, alkoxy alkylated benzoguanamine resin, and alkoxy alkylated urea resin, and specific examples thereof include methoxy methylated melamine resin, ethoxy methylated melamine resin, propoxy methylated melamine resin, butoxy methylated melamine resin, ethoxy methylated benzoguanamine resin, methoxy methylated urea resin, ethoxy methylated urea resin, propoxy methylated urea resin, and butoxy methylated urea resin.

These water-soluble crosslinking agents can be used singly or in a combination of two or more thereof, and these are compounded in an amount of 1 to 70 parts by weight, preferably 10 to 50 parts by weight, relative to 100 parts by weight of the water-soluble resin.

The surface active agent used in the water-soluble resin composition of the present invention includes acetylene alcohols, acetylene glycols, polyethoxylates of acetylene alcohols and polyethoxylates of acetylene glycols. Examples of the acetylene alcohols, acetylene glycols, polyethoxylates of acetylene alcohols and polyethoxylates of acetylene glycols, which can be used preferably in the present invention, include e.g. those compounds represented by formula (I):

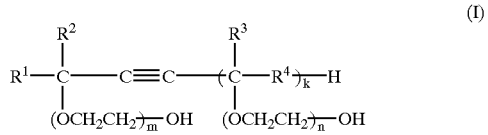

wherein $R^1$ represents a $C_{1-20}$ straight-chain or branched alkyld group, $R^2$ and $R^3$ independently represent H and a $C_{1-3}$ straight-chain or branched alkyl group, $R^4$ represents a $C_{1-20}$ straight-chain or branched alkylene group, k is 0 or 1, and m and n independently represent a positive number inclusive of 0.

Preferable examples of the acetylene alcohols, acetylene glycols, polyethoxylates of acetylene alcohols and polyethoxylates of acetylene glycols which can be used in the present invention include 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol and polyethoxylates thereof. In particular, tetramethyldecyne diols such as 2,4,7,9-tetramethyl-5-decyne-4,7-diol and polyethoxylates thereof are preferable. In the present invention, these surface active agents can be used singly or in a combination of two or more thereof, and these are compounded in an amount of usually 50 to 2,000 ppm, preferably 100 to 1,000 ppm, relative to the water-soluble resin composition of the present invention.

The solvent used in the water-soluble resin composition of the present invention may be any solvent in which the compounding ingredients in the water-soluble resin composition can be dissolved but an existing resist pattern formed on a substrate as an object of application of the water-soluble resin composition is not dissolved. This solvent is usually a solvent containing at least water, and specific examples thereof include water or a mixture of water and an organic solvent dissolved in such a range as to be soluble in water. The water used as the solvent in the present invention is not particularly limited insofar as it is water, but preferably used is pure water from which organic impurities, metal ions etc. have been removed by distillation, deionization, filtration or a wide variety of adsorption treatments.

On the other hand, the organic solvent dissolved in water is used usually for the purpose of improving the coating properties etc. of the composition. The organic solvent dissolved in water may be any organic solvent known in the art insofar as it is used in an amount in such a range as to be soluble in water. That is, any water-soluble organic solvent capable of being dissolved at 0.1% by weight or more in water can be used. The organic solvent used is preferably a water-compatible organic solvent. As the organic solvent which can be used in the present invention, there are illustrated, for example, alcohols such as methyl alcohol, ethyl alcohol, isopropyl alcohol, etc.; ketones such as acetone, methyl ethyl ketone, 2-heptanone, cyclohexanone, etc.; esters such as methyl acetate, ethyl acetate, etc.; ethylene glycol monoalkyl ethers such as ethylene glycol monomethyl ether, ethylene glycol monoethyl ether, etc.; ethylene glycol monoalkyl ether acetates such as ethylene glycol monomethyl ether acetate, ethylene glycol monoethyl ether acetate, etc.; propylene glycol monoalkyl ethers such as propylene glycol monomethyl ether, propylene glycol monoethyl ether, etc.; propylene glycol monoalkyl ether acetates such as propylene glycol monomethyl ether acetate, propylene glycol monoethyl ether acetate, etc.; lactic esters such as methyl lactate, ethyl lactate, etc.; aromatic hydrocarbons such as toluene, xylene, etc.; amides such as N,N-dimethylacetamide, N-methylpyrrolidone, etc.; lactones such as γ-butyrolactone, etc.; and polar solvents such as dimethylformamide, dimethyl sulfoxide, cellosolve, methyl cellosolve, butyl cellosolve, cellosolve acetate, butyl carbitol, carbitol acetate etc. As preferable organic solvents, there are illustrated $C_{1-4}$ lower alcohols such as methyl alcohol, ethyl alcohol, isopropyl alcohol etc., among which isopropyl alcohol is particularly preferable. These organic solvents can be used singly or in a combination of two or more thereof.

The resist material used for forming a resist pattern coated with the water-soluble resin composition of the present invention may be any photoresist material known in the art. The photoresist material may be one generating an acid by irradiation or heating, or the photoresist material itself may be one not generating an acid by irradiation or heating. If the resist material is one essentially not generating an acid by irradiation or heating, an acid or a material generating an acid by irradiation or heating may be added to the resist material. Alternatively, after a resist pattern is formed, the resist pattern may be treated with an acid solution or an acid vapor to impregnate the resist pattern with the acid.

The resist material is typically a mixture of novolak resin and a naphthoquinonediazide-based photosensitizer or a positive- or negative-working chemically amplified resist which upon irradiation, generates an acid to form a resist pattern by the catalytic action of the acid.

The water-soluble resin composition of the present invention can be used in any known methods of thickening the resist pattern in which a water-soluble resin composition is applied to a resist pattern formed on a substrate to form a coating layer thereof, then crosslinked by an acid supplied from the resist pattern, followed by removal of the non-crosslinked water-soluble resin composition by development. Hereinafter, a prior art method for thickening a resist pattern will be described, but is not intended to limit the method of applying the water-soluble resin composition of the present invention.

First, a photoresist is applied onto a substrate by known techniques such as spin coating. After pre-baking (e.g., for about 1 minute at a baking temperature of 70 to 140° C.), the resulting photoresist film is exposed with ultraviolet rays such as g-line or i-line, deep ultraviolet rays from a KrF excimer laser or an ArF excimer laser, X rays or electron beams and then subjected as necessary to post-exposure bake (PEB) (e.g. at a baking temperature of 50 to 140° C.), developed and baked (e.g. at a baking temperature of 60 to 120° C.) after development if necessary, to form a resist pattern. Then, the substrate having this resist pattern thereon is coated with the water-soluble resin composition and pre-baked as necessary (e.g., at 80 to 100° C. for 60 to 70 seconds) to form a coating layer film on the resist pattern. The method of applying the water-soluble resin composition may be any method capable of applying the water-soluble resin composition onto the resist pattern. As the methods, for example, there are illustrated spin coating method, spray coating method, dip coating method, roller coating method etc. which are conventionally used in coating of resists.

Then, both the resist pattern formed on the substrate and the coating layer formed thereon are subjected to heat-treatment (mixing-bake) thereby promoting the generation and diffusion of an acid in the resist pattern or promoting the diffusion of an acid present previously in the resist pattern, and by the acid thus diffused in the coating layer, the coating layer is crosslinked. The mixing-bake temperature and the baking time are suitably determined depending on the resist used, the material for forming the coating layer, and the thickness of coating to be crosslinked, but are usually about 85 to 150° C. and about 60 to 120 seconds, respectively. The coating layer thus crosslinked is developed with water, a mixture of water and a water-soluble organic solvent, or an aqueous solution of an alkali such as TMAH (tetramethylammonium hydroxide) to dissolve and remove the non-crosslinked coating layer. By the treatment described above, a trench pattern or a hole pattern can effectively be made fine.

If the resist can generate an acid upon exposure, the substrate having both the resist pattern and the coating layer is exposed as a whole or at desired parts by means of a light source for emitting a light corresponding to the exposure wavelength for the resist, and heated as necessary, thus generating an acid and diffusing the acid into the water-soluble resin composition, whereby the coating layer can be crosslinked as a whole or at the desired parts.

The thickness of coating to be crosslinked can be regulated as necessary by suitable selection of, for example, the resist material to be used, the thickness of resist coating, the amount of irradiation on the resist, the intensity of irradiation, the irradiation time, heating temperature, heating time, and the water-soluble resin composition to be used. The thickness of coating to be crosslinked can also be regulated by suitable selection of the water-soluble resin composition, e.g. selection of the type and amount of the water-soluble resin and the crosslinking agent used therein, or the mixing ratio of water-soluble resins or crosslinking agents when plural water-soluble resins or crosslinking agents are used in combination.

BEST MODE FOR CARRYING OUT THE INVENTION

Hereinafter, the present invention will be described more definitely by reference to the Examples, which however are not intended to limit the present invention.

EXAMPLE 1

Preparation of Water-soluble Resin Composition A

The respective components in the ratio described below were mixed, sufficiently stirred, dissolved and filtered through a 0.2 $\mu$m filter to prepare the water-soluble resin composition A.

| (Components) | (Parts by weight) |
|---|---|
| Polyvinyl alcohol | 8.0 |
| Methoxy methylated melamine | 2.0 |
| 2,4,7,9-Tetramethyl-5-decyne-4,7-diol polyethoxylate | 0.001 |
| Isopropyl alcohol | 10.0 |
| Water | 79.999 |

COMPARATIVE EXAMPLE 1

Preparation of Water-soluble Resin Composition B

The water-soluble resin composition B was prepared in the same manner as in Example 1 except that the respective components in the ratio described below were used.

| (Components) | (Parts by weight) |
|---|---|
| Polyvinyl alcohol | 8.0 |
| Methoxy methylated melamime | 2.0 |
| Isopropyl alcohol | 10.0 |
| Water | 80.0 |

COMPARATIVE EXAMPLE 2

Preparation of Water-soluble Resin Composition C

The water-soluble resin composition C was prepared in the same manner as in Example 1 except that the respective components in the ratio described below were used.

| (Components) | (Parts by weight) |
|---|---|
| Polyvinyl alcohol | 8.0 |
| Methoxy methylated melamine | 2.0 |
| Megafac R-08 (Dainippon Ink and Chemicals, Inc.) | 0.001 |
| Isopropyl alcohol | 10.0 |
| Water | 79.999 |

EXAMPLE 2

Evaluation of the Water-soluble Resin Composition A

Formation of Line and Space Patterns

A positive-working photosensitive resin composition AZ® 7900 (manufactured by Clariant Japan K.K.) was applied by a spin coater MK-V made by Tokyo Electron Ltd. onto a 6-inch silicon wafer previously treated with HMDS (hexamethyl disilazane), followed by pre-baking thereof on a hot plate at 90° C. for 60 seconds to give an about 0.96 μm resist film thereon. Using an exposure unit (LD-5015iCW made by Hitachi, Ltd., NA=0.50) having the exposure wavelength of i-line (365 nm), the resist film was exposed through line and space patterns having a variety of line and space widths and then subjected to post exposure baking (PEB) on a hot plate at 110° C. for 60 seconds, followed by spray puddle development for 1 minute at 23° C. with an alkali developing solution manufactured by Clariant Japan K.K. (AZ® 300 MIF developer, 2.38 weight-% aqueous tetramethylammonium hydroxide) to give positive-working resist patterns.

Formation of Contact Hole Patterns

A positive-working photosensitive resin composition AZ® DX3200P (manufactured by Clariant Japan K.K.) was applied by a spin coater MK-V made by Tokyo Electron Ltd. onto a 6-inch silicon wafer previously treated with HMDS followed by pre-baking on a hot plate at 80° C. for 60 seconds to give an about 0.8 μm resist film thereon. Using an exposure unit (FPA-3000EX5 made by Canon Inc., NA=0.63) having the exposure wavelength of KrF laser (248 nm), the resist film was exposed through hole patterns having a variety of hole diameters and then subjected to post exposure baking (PEB) on a hot plate at 110° C. for 60 seconds, followed by spray puddle development for 1 minute at 23° C. with an alkali developing solution (AZ® 300 MIF developer manufactured by Clariant Japan K.K., 2.38 weight-% aqueous tetramethylammonium hydroxide) to give positive-working resist patterns.

Evaluation of Coating Characteristics

The water-soluble resin composition A was applied by a spin coater LT-1000 made by Litho Tech Japan co. on the line and space resist patterns and the contact hole resist patterns formed by above-described methods and then baked on a hot plate at 85° C. for 70 seconds to prepare a water-soluble resin coating of about 0.4 μm in thickness. Whether coating defects such as striations and fish eyes had occurred on the coating film on the line and space resist patterns or the contact hole resist patterns were examined by eyes and under an optical microscope to evaluate the coating characteristics thereof. The results are shown in Table 1.

Coating characteristics were evaluated according to the following criteria:

Criteria for Evaluation of Coating Characteristics

○: Unevenness on the coating, such as fish eyes and striations, is not observed and a uniform coating film is formed.

Δ: A satisfactory film is formed without repelling such as fish eyes, but unevenness such as striations on the coating is observed because of insufficient covering characteristics on steps of the resist patterns.

X: Repelling such as fish eyes occurs, and it is difficult to form a satisfactory film.

Evaluation of Degrees of Reduction in Size

The water-soluble resin was applied by a spin coater LT-1000 made by Litho Tech Japan Co. onto the line and space resist patterns and the contact hole resist patterns formed by above-described methods and then baked on a hot plate at 85° C. for 70 seconds to prepare a water-soluble resin film of about 0.4 μm in thickness thereon. Then, the specimens were subjected to mixing bake on a hot plate at 110° C. for 90 seconds so that crosslinking reaction progressed, followed by development thereof with pure water at 23° C. for 1 minute to remove the non-crosslinked layer, whereby a crosslinked insolubilized layer of the water-soluble resin film was obtained on the line and space resist patterns and the contact hole resist patterns. Further, the specimens were subjected to baking treatment for drying on the hot plate at 110° C. for 120 seconds. For evaluation of degrees of reduction in size, the space width of the line and space pattern and the hole diameter of the contact hole pattern before and after formation of the insolubilized layer were measured by a unit (S-7280H) for high-accuracy evaluation of outward appearance made by Hitachi, Ltd., and the evaluation was conducted by comparing changes in the measured values. The degrees of reduction in size were determined according to the following equation. The results are shown in Table 1.

Degree of reduction in size (%)=[(size before formation of the insolubilized layer)−(size after formation of the insolubilized layer)]/(size before formation of the insolubilized layer)]×100

COMPARATIVE EXAMPLES 3 and 4

Evaluation of the Water-soluble Resin Compositions B and C

The coating characteristics and the degrees of reduction in size were evaluated in the same manner as in Example 2 except that the water-soluble resin compositions B and C were used in place of the water-soluble resin composition A. The results are shown in Table 1.

TABLE 1

| | Water-soluble resin composition | Coating characteristics | | Degree of reduction in size | |
|---|---|---|---|---|---|
| | | AZ 7900 | AZ DX 3200P | AZ 7900 | AZ DX 3200P |
| Example 2 | A | ○ | ○ | 43.6 | 51.0 |
| Comparative Example 3 | B | Δ | Δ | 37.1 | 45.5 |
| Comparative Example 4 | C | X | X | 37.6 | 46.8 |

EFFECT OF THE INVENTION

As is evident from the foregoing description, the water-soluble resin composition of the present invention is excellent in coating characteristics on a step of a resist pattern and in regulation of the size of its hardened film. Therefore, regardless of the surface conditions of a substrate, pattern gaps between resist patterns can be made fine effectively and accurately, and a pattern exceeding a wavelength limit can be formed excellently and economically. Further, the fine resist pattern thus formed can be used as a mask to form reduced trench patterns and holes on semiconductor substrates, whereby semiconductor devices etc. having the fine trench patterns or holes can be produced easily in high yield.

Industrial Applicability

As described above, the water-soluble resin composition of the present invention can be used effectively in a process for producing semiconductor devices etc. for reducing the size of spaces in the resist patterns by thickening resist patterns formed to effectively make fine trench patterns or hole patterns.

What is claimed is:

1. A water-soluble resin composition comprising a water-soluble resin, a water-soluble crosslinking agent, a surface active agent and a solvent and capable of a crosslinking reaction in the presence of an acid, wherein said surface active agent is at least one member selected from acetylene alcohols, acetylene glycols, acetylene alcohol polyethoxylates, and acetylene glycol polyethoxylates; wherein the water-soluble resin is at least one homopolymer or copolymer, containing hydrophilic units, said homopolymer or copolymer being at least one member selected from the group consisting of polyvinyl alcohol (including partially saponified products), polyacrylic acid homopolymer, polymethacrylic acid homopolymer, poly(2-hydroxyethyl acrylate), poly(2-hydroxyethyl methacrylate), poly(4-hydroxybutyl acrylate), poly(4-hydroxybutyl methacrylate), poly(glucosiloxyethyl acrylate), poly(glucosiloxyethyl methacrylate), polyvinyl methyl ether, polyvinyl pyrrolidone, polyethylene glycol, polyvinyl acetal (including partial-acetal products), polyethylene imine, polyethylene oxide, polyvinyl amine, polyallyl amine, oxazoline group-containing water-soluble resin, water-soluble urea resin, alkyd resin, and sulfonamide, as well as salts thereof.

2. The water-soluble resin composition according to claim 1, wherein said surface active agent is at least one member selected from 2,4,7,9-tetramethyl-5-decyne-4,7-diol and 2,4,7,9-tetramethyl-5decyne4,7-diol polyethoxylates.

3. The water-soluble resin composition according to claim 1, wherein the content of said surface active agent in the water-soluble resin composition is 50 to 2,000 ppm.

4. The water-soluble resin composition according to claim 1, wherein said water-soluble resin is at least one member selected from polyvinyl acetal and polyvinyl alcohol.

5. The water-soluble resin composition according to claim 1, wherein said water-soluble crosslinking agent is at least one member selected from melamine based low-molecular derivatives, guanamine based low-molecular derivatives, urea based low-molecular derivatives, glycoluril and alkoxy alkylated amino resin.

6. The water-soluble resin composition according to claim 1, wherein said solvent is water or a mixture of water and an organic solvent compatible with water.

7. The water-soluble resin composition according to claim 6, wherein said organic solvent compatible with water is a $C_1$ to $C_4$ alcohol.

8. The water-soluble resin composition according to claim 7, wherein said $C_1$ to $C_4$ alcohol is isopropyl alcohol.

9. A pattern-forming material comprising a water-soluble resin composition according to claim 1.

* * * * *